United States Patent [19]

Heitman et al.

[11] Patent Number: 4,613,926
[45] Date of Patent: Sep. 23, 1986

[54] FIBER OPTIC ILLUMINATING ASSEMBLY

[75] Inventors: Christopher J. Heitman; Gregory D. Schwehr, both of Milwaukee, Wis.

[73] Assignee: General Electric Company, Milwaukee, Wis.

[21] Appl. No.: 666,859

[22] Filed: Oct. 31, 1984

[51] Int. Cl.$^4$ ............................................... F21V 7/04
[52] U.S. Cl. ....................................... 362/32; 362/248; 362/294; 128/1.3; 350/96.24
[58] Field of Search ............... 128/1.3; 350/96.24, 350/96.27, 96.1; 362/32, 236, 355, 330, 294, 33, 238, 240, 244, 248, 294; 269/328

[56] References Cited

U.S. PATENT DOCUMENTS

| 2,480,178 | 8/1949 | Zinberg | 350/96.1 |
| 3,962,702 | 6/1976 | Kriege | 350/96.1 |
| 4,092,705 | 5/1978 | Hogberg | 362/294 |
| 4,151,582 | 4/1979 | Grunberger | 350/96.1 |
| 4,316,453 | 2/1982 | Harrison | 128/1.3 |

FOREIGN PATENT DOCUMENTS

| 0069977 | 1/1983 | European Pat. Off. | 362/32 |
| 0001103 | 1/1983 | Japan | 350/96.1 |

Primary Examiner—Charles J. Myhre
Assistant Examiner—David A. Okonsky
Attorney, Agent, or Firm—Alexander M. Gerasimow; Douglas E. Stoner

[57] ABSTRACT

A fiber optic illuminating assembly for indirectly and uniformly illuminating the bore of a magnetic resonance (MR) scanner utilizes, in the preferred embodiment, a pair of plastic fiber optic bundles located in the bore behind a deflector element. The fiber optic bundles are made up of many optical fibers cut to different lengths to create point light sources spaced along the length of the bore. A frosted tube surrounds the bundle portion with the point light sources and operates to uniformly diffuse the light. The input ends of the fiber optic bundles are illuminated through an infrared mirror by a non-magnetic quartz-halogen light source operated from a direct current power supply to prolong filament life.

19 Claims, 3 Drawing Figures

FIBER OPTIC ILLUMINATING ASSEMBLY

BACKGROUND OF THE INVENTION

This invention relates to medical diagnostic apparatus. More specifically, this invention relates to a fiber optic illuminating assembly for lighting the bore of a magnet forming part of a magnetic resonance (MR) scanner, with respect to which the preferred embodiment of the invention is disclosed.

An MR scanner typically comprises a magnet, often of superconductive design, of generally solenoidal geometry having a longitudinal bore for receiving the object to be examined. In medical diagnostic applications, the object is a patient so that it is desirable to enhance patient comfort and to allow visual contact between the patient and attending personnel. Such considerations are particularly important with very ill patients. To this end, it is advantageous to illuminate the bore, which in the case of a whole-body MR scanner can be approximately 8 feet long.

Illumination of the bore, however, cannot be accomplished simply using conventional techniques due to the highly magnetic environment in the vicinity of the magnet. For example, fields of 1.5 Tesla, or more, are typically employed in MR scanners using superconductive magnets. Additionally, because of the relative weakness of the MR signal sought to be detected in the course of scanning a patient and the concomitant need to maximize the signal-to-noise ratio, it is essential that interference from all sources be minimized. In fact, MR scanners are frequently housed in RF opaque screen rooms providing about 90 db of bidirectional radio frequency (RF) attenuation. Further, because of the magnetic environment and the proximity to the RF coils used to excite and detect MR signals, no electrically conductive or magnetic materials can be used within the bore of the scanner. This requirement dictates the need for a remote light source to illuminate the bore. Such a light source must, of course, be consistently producible at an economical cost. Another factor which must be considered is the life expectancy of the components used due to the aforedescribed magnetic environment.

It is, therefore, a principal object of the invention to provide an illuminating device which meets the stringent reliability and operability requirements for use with an MR scanner.

It is another object of the invention to provide an illuminating device which is consistently producible at an economical cost.

It is still another object of the invention to provide an illuminating device which uniformly illuminates the bore of an MR scanner.

SUMMARY OF THE INVENTION

An inventive device for illuminating the bore of an MR scanner apparatus includes a light source disposed remotely from the bore and fiber optic means made up of a plurality of optical fiber filaments operatively coupled at the input ends to the light source, while the output ends extend into the bore. The optical fiber filaments have different lengths such that the filaments terminate at spaced intervals along the length of the bore. In this manner, light emanating from the output ends of the optical fiber filaments, when the light source is energized, illuminate a different region of the bore.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
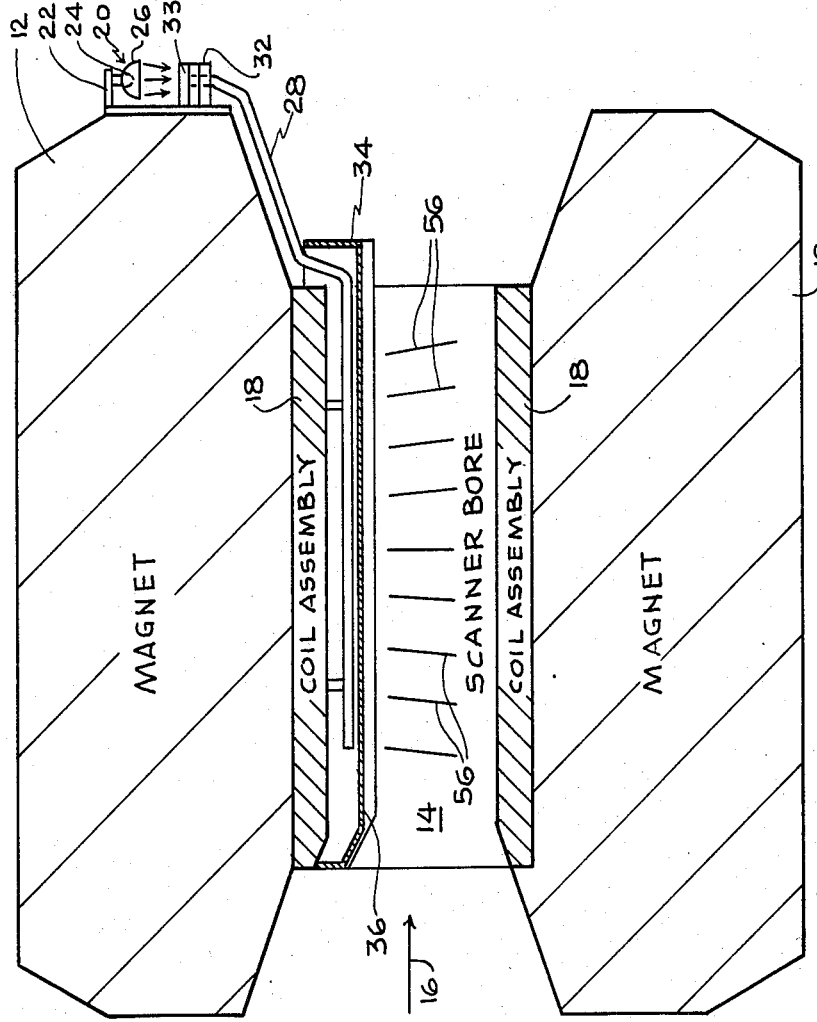
FIG. 1 is a sectional view of the magnet portion of a MR scanner taken vertically through the longitudinal axis.

FIG. 1 depicts a magnet assembly, generally designated 10, which forms part of an MR scanner. The assembly is comprised of a magnet 12 for producing the homogeneous polarizing magnetic field necessary to carry out MR studies. The magnet includes a bore 14 for receiving a patient (head first, typically) from the direction indicated by Arrow 16. A coil assembly 18 is positioned within the bore of the magnet and is typically comprised of coaxially assembled RF, gradient and shim coils (not shown individually). The RF coil assembly used for transmitting and receiving RF signals is positioned nearest the center of the scanner bore, while the shim coil assembly used for correcting inhomogeneities in the polarizing magnetic field is outermost. The gradient coil assembly is interposed between the RF and shim coil assemblies and includes three separate coils for generating gradient magnetic fields in the X, Y, and Z directions of the Cartesian coordinate system. The gradient magnetic fields are utilized for localizing MR spin information to a specific volume of the patient undergoing examination.

Figure 2:
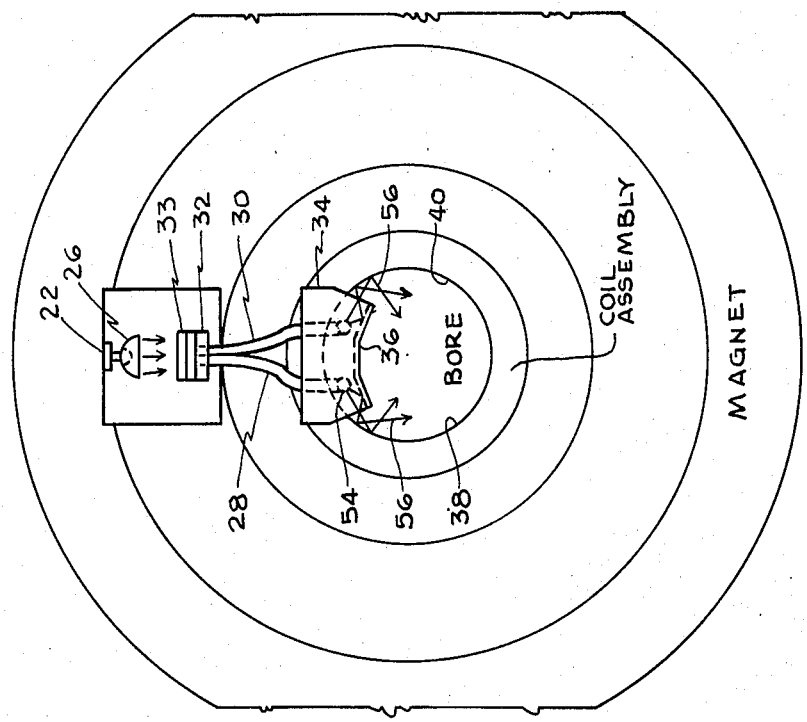
FIG. 2 is an end view of the MR magnet depicted in FIG. 1.

Referring now to FIGS. 1 and 2, a non-magnetic quartz-halogen light source 20 is mounted to the end-ring region of magnet 12 with the aid of a mounting bracket 22. In the preferred embodiment of the invention, mounting bracket 22 and light source 20 are mounted to the end of the magnet assembly opposite to that through which the patient normally advances into the scanner. This location is sufficiently removed from the RF coil assembly to prevent any adverse effects thereon. It will be recognized, of course, that this position is merely exemplary and that other positions may be advantageously employed, provided such locations are selected with the aim of minimizing interference with the operation of the scanner. A low voltage, high current quartz-halogen bulb 24 is advantageously used in source 20 because it is constructed with a very strong filament which can resist the force caused by the interaction between the magnetic field produced by current flowing through the filament when the light is energized, and the large polarizing magnetic field produced by the magnet. The bulb is energized with a DC source (not shown) to prevent the filament from vibrating which would greatly shorten its life. The vibration, of course, would be due to the flow of alternating current in the filament creating an oscillating magnetic field which in the presence of the polarizing magnetic field would cause the filament to experience torques directed in opposite directions. Light source 20 is provided with an integral reflector 26 which surrounds bulb 24 and which concentrates the light to a 1 inch diameter area at a distance of approximately two and one-half inches in front of the bulb. Two substantially identical fiber optic bundles 29 and 30 are clamped to light source 20 with a clamp 32, such that the polished input ends thereof are located at the 1 inch diameter focal spot. Fiber optic bundles 28 and 30 conduct light from the single light source to the bore assembly. In the preferred embodiment, in which plastic fiber optic elements are used, an infrared mirror 33 is mounted between the light source and the input ends of the fiber optic bundles. The fiber optic bundles enter the upper region of the bore through a patient comfort module 34 and are positioned behind a deflector 36. Within the bore, the bundles are spaced apart and extend longitudinally along the length of the deflector generally parallel to one another. The objective is to have each fiber bundle spread the light entering its input end on sides 38 and 40 of the bore along approximately a 4 foot length so that the bore is illuminated uniformly. A greater length of the bore could be illuminated if longer bundles are employed.

The manner in which uniform lighting of the scanner bore is achieved will now be described with reference to FIG. 3. which depicts one exemplary fiber optic bundle such as the one designated with reference numeral 28. Uniform lighting of the scanner bore is accomplished in general by staggering the lengths of each optic fiber comprising a bundle. In one embodiment of the invention, it has been found that a bundle containing 94 fibers provides sufficient light to adequately illuminate the bore. It will be recognized, of course, that a number of fibers higher or lower than 94 can be advantageously employed, as required. The shortest of the fibers is approximately 30.5 inches in length measured from the input end, and each successive fiber is ½ inch longer so that the longest fiber is approximately 77 inches in length. The light entering input end 46 of the fiber optic bundle, as suggested by arrows 48, is thus dispersed as 94 evenly spaced point sources of light, collectively designated by reference numeral 50, along a 46.5 inch section of the fiber optic bundle. The entire bundle is encased in a clear, flame-retardant vinyl heat-shrink tube 52 to protect it from damage and to make it easy to handle. Additional ease of handling is obtained by twisting helically the fibers comprising the first 30 inches of the bundle near the input end. The twisting has the effect of improving the flexibility of the bundle. The fibers are potted with epoxy for a length of approximately ¾ inch from the input end in order to prevent excessive shifting and to allow the input end to be polished easily. To this end, an epoxy which is flexible and which has low viscosity is selected. A suitable epoxy has been found to be that supplied by Tra-Con Company (Medford, Mass.), under the designation F113. It will be recognized that in general the epoxy need not be clear since the light is contained within the fibers.

Figure 3:
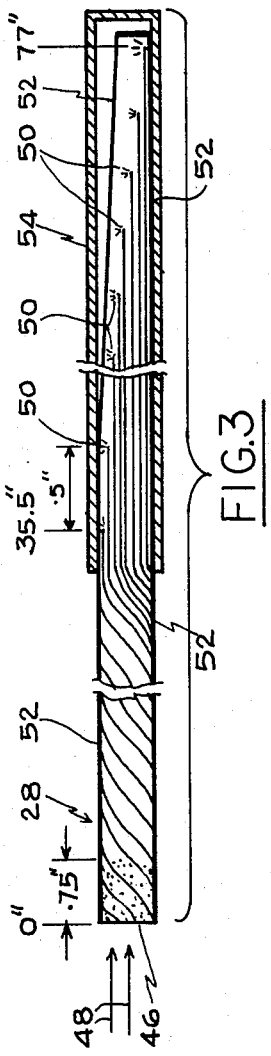
FIG. 3 is an exemplary embodiment of a fiber optic assembly utilized with the illuminating device in accordance with the invention.

Continuing now with reference to FIGS. 2 and 3, when installed in the bore, a portion of each bundle that gives off light (e.g., that portion containing point light sources 50) is placed within a clear plastic tube 54 that has been frosted on its interior and exterior surfaces. The frosting can be conveniently achieved by vapor blasting both surfaces to achieve a roughened surface which aids in diffusing the point sources of light to provide even lighting along the length of the bore. In use, the frosted tube enclosing each of the fiber optic bundles is not visible to the patient, since they are located behind deflector 36. Instead, light is reflected (as suggested by arrows 56) off the surfaces of the deflector and the bore, such as those designated 38 and 40. Such indirect lighting arrangement helps to further diffuse the light so that no bright or dark spots are visible along the length of the bore. Alternatively, tube 54 may also be fabricated from a plastic material into which a white pigment has been incorporated. In this case, it is also desirable to vapor blast both surfaces of the tube to provide good diffusion properties.

In the preferred embodiment, the fiber used to construct the fiber optic bundles comprises a low attenuation filament consisting of a light-transmitting core of polymethyl methacrylate clad with an optical fluorocarbon sheath. A suitable fiber is one made by E. I. DuPont de Nemours Company (Wilmington, Del.) under the trade name of Crofon. If a plastic fiber of this type is utilized, because of the large amount of infrared energy given off by the quartz-halogen bulb 24 in FIGS. 1 and 2, the fibers would normally melt when mounted adjacent to the light source. Therefore, to avoid melting the fibers, infrared mirror 33 (FIGS. 1 and 2) is mounted between the light source and the fiber optic input ends. Infrared mirror 33 is a specially coated heat-resistant glass plate that transmits 85 percent of the visible light and reflects 90 percent of the infrared energy. Therefore, it allows highly concentrated visible light from the quartz-halogen lamp to illuminate the ends of the fiber optic bundles, while reflecting undesirable infrared energy.

It will be appreciated from the foregoing that in accordance with the invention there is provided a fiber optic illuminating assembly which meets the stringent reliability and operability requirements attendant to use with an MR scanner. The illuminating assembly which is consistently producible at an economical cost and which is capable of uniformly illuminating the bore of a MR scanner.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A device for illuminating a bore of an MR scanner apparatus, comprising:
    light source means disposed remotely from the bore; and
    a fiber optic bundle made up of a plurality of optical fiber filaments operatively coupled at input ends thereof to said light source means, output ends of said optical fiber filaments extending into the bore of the MR scanner apparatus, said optical fiber filaments having different lengths such that predetermined ones of the filaments terminate at spaced intervals along a length of the bore, wherein light emanating from the output ends of said optical fiber filaments, when said light source means is energized, illiminates the bore.

2. The device of claim 1 wherein said light source means comprises a non-magnetic quartz-halogen light, including a low-voltage, high-current bulb.

3. The device of claim 1 wherein a predetermined length of said fiber optic filaments, measured from the input ends thereof, is potted with an epoxy composition to prevent shifting of said fiber optic filaments and to allow the input ends to polished easily.

4. The device of claim 1 further comprising infrared mirror means interposed between said light source means and the input ends of said optical fiber filaments.

5. The device of claim 1 wherein said plurality of optical fiber filaments comprise plastic optical fiber filaments.

6. The device of claim 5 further comprising infrared mirror means interposed between said light source means and the input ends of said optical fiber filaments.

7. The device of claim 1 further comprising means for diffusing the light emanating from the output ends of said optical fiber elements to uniformly illuminate the bore of the MR scanner apparatus.

8. The device of claim 7 wherein said means for diffusing comprises a frosted tube which encloses the output ends of said plurality of optical fiber filaments.

9. The device of claim 7 wherein said plurality of optical fiber filaments comprise plastic optical fiber filaments.

10. The device of claim 9 further comprising infrared mirror means interposed between said light source means and the input ends of said optical fiber filaments.

11. The device of claim 10 further comprising deflector means disposed longitudinally within the bore of said MR scanner apparatus, said fiber optic means being disposed between said deflector means and the wall of the bore, said deflector means being operable for deflecting the light emanating from the output ends of said optical fiber filaments, when said light source means is energized, to indirectly illuminate the bore.

12. The device of claim 1 further comprising means for encasing said plurality of optical fiber filaments, said means for encasing forming a protective sheath around said optical fiber filaments.

13. The device of claim 12 wherein said means for encasing comprises a clear, flame-retardant vinyl heat shrink tube.

14. The device of claim 12 wherein a predetermined length of said fiber optic filaments, measured from the input ends thereof, is potted with an epoxy composition to prevent shifting of said fiber optic filaments and to allow the input ends to be polished easily.

15. The device of claim 14 further comprising means for diffusing the light emanating from the output ends of said optical fiber elements to uniformly illuminate the bore of the MR scanner apparatus.

16. The device of claim 15 wherein said means for diffusing comprises a frosted tube which encloses the output ends of said plurality of optical fiber filaments.

17. The device of claim 16 wherein said plurality of optical fiber filaments comprise plastic optical fiber filaments.

18. The device of claim 17 wherein said plastic optical fiber filaments comprise filaments having low optical attenuation and which are made up of a light-transmitting core of polymethyl methacrylate clad with an optical fluorocarbon sheath.

19. The device of claim 17 further comprising infrared mirror means interposed between said light source means and the input ends of said optical fiber filaments.

* * * * *